United States Patent [19]

Fujishima et al.

[11] Patent Number: 4,926,385
[45] Date of Patent: May 15, 1990

[54] SEMICONDUCTOR MEMORY DEVICE WITH CACHE MEMORY ADDRESSABLE BY BLOCK WITHIN EACH COLUMN

[75] Inventors: Kazuyasu Fujishima; Hideto Hidaka; Mikio Asakura; Yoshio Matsuda, all of Hyogo, Japan

[73] Assignee: Mitsubishi Denki Kabushiki Kaisha, Tokyo, Japan

[21] Appl. No.: 228,589

[22] Filed: Aug. 5, 1988

[30] Foreign Application Priority Data

Aug. 5, 1987 [JP] Japan .................................. 62-196823

[51] Int. Cl.$^5$ ................................................ G11C 7/00
[52] U.S. Cl. .............................. 365/230.03; 365/240; 365/230.08
[58] Field of Search ...................... 365/189.05, 230.03, 365/230.08, 240, 238–239

[56] References Cited

U.S. PATENT DOCUMENTS

| | | | |
|---|---|---|---|
| 4,330,852 | 5/1982 | Redwine et al. | 365/221 X |
| 4,577,293 | 3/1986 | Matick et al. | 365/189 X |
| 4,725,945 | 2/1988 | Kronstadt et al. | 365/230.03 |
| 4,755,974 | 7/1988 | Yamada et al. | 365/230.03 |
| 4,803,621 | 2/1989 | Kelly | 365/230.03 |

FOREIGN PATENT DOCUMENTS

| | | | |
|---|---|---|---|
| 0167089 | 1/1986 | European Pat. Off. | 365/230.03 |
| 0595481 | 1/1984 | Japan | 365/230.03 |

Primary Examiner—Stuart N. Hecker
Assistant Examiner—Alfonso Garcia
Attorney, Agent, or Firm—Lowe, Price, LeBlanc, Becker & Shur

[57] ABSTRACT

A semiconductor memory includes a memory cell array having a plurality of bit lines and a plurality of word lines arranged intersecting with the bit lines. A plurality of memory cells are arranged at intersections of the bit lines and the word lines, respectively. Word line selecting circuitry selects one of the word lines responsive to a row address and reads out to each of the bit lines information stored in the memory cell associated with the selected word line. A plurality of sense amplifiers are associated with corresponding rows of the memory for detecting and amplifying the information stored in respective memory cells. A first column selector circuit selects the sense amplifiers corresponding to a column address when the column address is applied and reads information held in the sense amplifier. Blocks are formed by dividing the memory cell array into groups of bit lines, each of the groups comprising a predetermined number of bit lines with block information transferred simultaneously from corresponding ones of the groups of bit lines of a selected block when the column address corresponding to the selected block is applied. Data registers hold information of an associated block. A second column selector reads data corresponding to the column address from the data register when the column address is applied.

7 Claims, 9 Drawing Sheets

NORMAL READ CYCLE

PAGE MODE CYCLE

STATIC COLUMN MODE CYCLE

SEMICONDUCTOR MEMORY DEVICE WITH CACHE MEMORY ADDRESSABLE BY BLOCK WITHIN EACH COLUMN

BACKGROUND OF THE INVENTION

1. Field of the Invention

The present invention relates generally to a semiconductor memory device for a simple cache system, and more particularly, to a semiconductor memory in which a cache memory is integrated on the same chip.

2. Description of the Prior Art

In order to improve cost performance of a computer system, a small capacity and high-speed memory has been frequently provided as a high-speed buffer between a main memory structured by a low-speed, large capacity and thus, low-cost DRAM (Dynamic Random Access Memory) and a CPU (Central Processing Unit). The high-speed buffer is referred to as a cache memory. A block of data which the CPU may require is copied from the main memory and stored in the cache memory. The state in which data in an address to be accessed by the CPU exists in the cache memory is referred to as "hit". In this case, the CPU makes access to the high-speed cache memory. On the other hand, the state in which data in an address to be accessed by the CPU does not exist in the cache memory is referred to as "miss hit". In this case, the CPU makes access to the low-speed main memory and at the same time, transfers to the cache memory a block to which the data belong.

The above described cache system cannot be employed in a small-sized computer system attaching importance to the cost because it requires a high-cost and high-speed memory. Conventionally, the simple cache system has been configured utilizing a page mode and a static column mode of a general-purpose DRAM.

FIGS. 1A, 1B and 1C are timing charts showing operation timing of a normal read cycle, a page mode cycle and a static column mode cycle in the DRAM, respectively. Referring now to FIGS. 1A to 1C, the operations in the conventional DRAM will be described.

First, in the normal read cycle, a row address (RA) is acquired in a device at a falling edge of an $\overline{RAS}$ (Row Address Strobe) signal while a column address (CA) is acquired therein at a falling edge of a $\overline{CAS}$ (Column Address Strobe) signal. Data in a memory cell selected by the acquired row and column addresses (RA, CA) is outputted. Therefore, the access time requires $t_{RAC}$ (an $\overline{RAS}$ access time) from the falling edge of the $\overline{RAS}$ signal. A cycle time tc is the sum of a period during which the device is active and an $\overline{RAS}$ precharge period $t_{RP}$. As a standard value, tc is approximately 200 ns in the DRAM with $t_{RAC}$ of 100 ns.

On the other hand, in the page mode and the static column mode, access is made to memory cells on the same row by changing the column address (CA). The page mode and the static column mode differ in that the column address (CA) is latched at the falling edge of the $\overline{CAS}$ signal while access is made only by the change of the column address (CA) as in an SRAM (Static Random Access Memory). Access times $t_{CAC}$ and $t_{AA}$ become values of approximately one-half of the RAS access time $t_{RAC}$, i.e., approximately 50 ns, as compared with $t_{RAS}=100$ ns. In addition, the cycle time is shortened. The cycle time in the page mode becomes the same value as that in the static column mode, i.e., approximately 50 ns which may differ depending on the value of the $\overline{CAS}$ precharge period $t_{CP}$.

FIG. 2 is a block diagram showing basic structure of a conventional DRAM device operable in a page mode or a static column mode. A row decoder 3 selects one word line (included in a memory cell array 5) in response to a row address (RA) acquired in a row address buffer 1 at a falling edge of a $\overline{RAS}$ signal. A sense amplifier 6 detects and amplifies information in a plurality of memory cells (included in the memory cell array 5) connected to the word line through a plurality of bit lines (included in the memory cell array 5). At the time point, information corresponding to one row is latched in the sense amplifier 6. Consequently, a sense amplifier on each column is selected in response to a column address (CA), so that a page mode operation and a static column mode operation can be performed.

FIG. 3 is a diagram showing the outline of a conventional simple cache system utilizing the above described page mode (or the static column mode). FIG. 3 shows a 1 M byte memory system comprising 8 DRAM devices 22 each having $1M \times 1$ structure. Thus, the number of address lines is 20 ($2^{20}=1048576=1$ M) before a row address and a column address are multiplexed. When the address lines are actually inputted to the devices, the row address and the column address are multiplexed in the direction of a time base, so that the number of address lines is 10, i.e., $A_0$ to $A_8$.

Referring now to a timing chart of FIG. 4, description is made on an operation of a simple cache system shown in FIG. 3. An address generator 17 generates 20 addresses of data which the CPU23 requires. A comparator 19 compares 10 addresses corresponding to the row address (RA) out of 20 addresses with a row address selected in the preceding cycle from a latch (referred to as TAG hereinafter) 18 which holds the row address. At that time, when both coincide with each other, it means that access is made on the same row as that in the preceding cycle (hit occurs), so that the comparator 19 generates a CH (Cash Hit) signal. A state machine 20 is responsive to generation of the CH signal for performing page mode control which toggles the $\overline{CAS}$ signal while holding the $\overline{RAS}$ signal at a low level. A multiplexer 21 supplies 10 column addresses (CA) to DRAM devices 22. As described above, when hit occurs, output data are obtained from the DRAM devices 22 at high speed in an access time to $t_{CAC}$. Contrary to this, when the row address inputted to the comparator 19 does not coincide with the content of the TAG18, it means that access is made on a different row from that in the preceding cycle (miss hit occurs), so that the comparator 19 does not generate the $\overline{CH}$ signal. In this case, the state machine 20 performs $\overline{RAS}$ and $\overline{CAS}$ control in the normal read cycle. The address multiplexer 21 supplies to the DRAM devices 22 addresses multiplexed in the order of the row address (RA) and the column address (CA). As described above, when miss hit occurs, a normal cycle, beginning with precharging of the RAS signal is started, so that output data are obtained at low speed in an access time of $t_{RAC}$. Thus, the state machine 20 generates a WAIT signal, to bring a CPU23 into a WAIT state. When miss hit occurs, a new row address is held in the TAG18.

As described in the foregoing, the conventional simple cache system is adapted such that one row (1024 bits in the case of a 1 M bit device) of the DRAM constitutes one block. In addition, only address data corresponding to one block is entered in the TAG18. Therefore, hit occurs only when data to be accessed this time is on the same row as that of data accessed last time, so that a cache hit rate is low.

Meanwhile, as another conventional example, a simple cache system disclosed in the U.S. Pat. No. 4,577,293 has been known. In this simple cache system, a register for holding data corresponding to one row is provided outside a memory cell array and data is directly extracted from this register when hit occurs, so that accessing is speeded up. However, the external register holds as one block data corresponding to one row in the memory cell array, so that a cache hit rate is low as in the conventional example shown in FIGS. 2 and 3.

SUMMARY OF THE INVENTION

An object of the present invention is to solve the above described problems and to provide a semiconductor memory device for a simple cache system having a high hit rate.

Briefly stated, according to the present invention, a memory cell array is divided into a plurality of blocks, so that data of the plurality of blocks are held in a data register serving as a cache memory.

According to the present invention, since data blocks of different rows can be held in the data register, a hit rate of a simple cache system configured using the semiconductor memory device can be improved. More specifically, the data length of one block becomes shorter than that of the conventional device. However, data stored in the memory cell array have locality (related data are arranged close to each other) in the row direction. Thus, the hit rate on a block basis is slightly lowered. However, the hit rate as a whole can be significantly improved, as compared with that of the conventional device.

These objects and other objects, features, aspects and advantages of the present invention will become more apparent from the following detailed description of the present invention when taken in conjunction with the accompanying drawings.

DESCRIPTION OF THE PREFERRED EMBODIMENTS

Figure 1A:
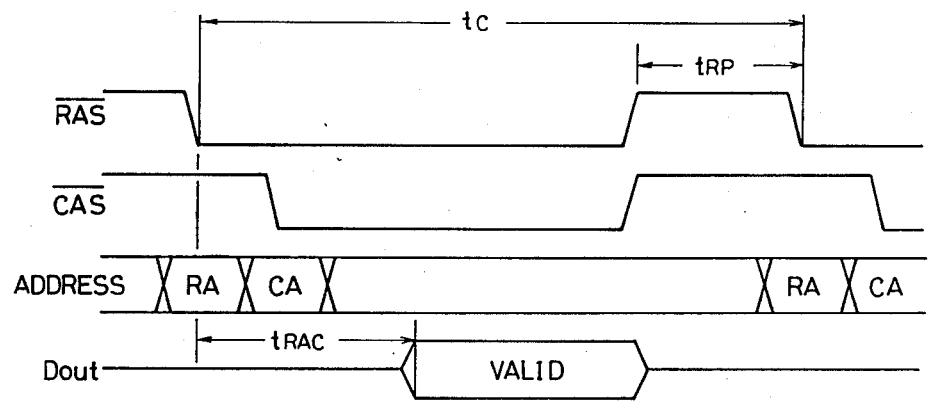
FIGS. 1A, 1B and 1C are timing charts for explaining operations of a normal read cycle, a page mode cycle and a static column mode cycle in a conventional semiconductor memory device, respectively.
Figure 1B:
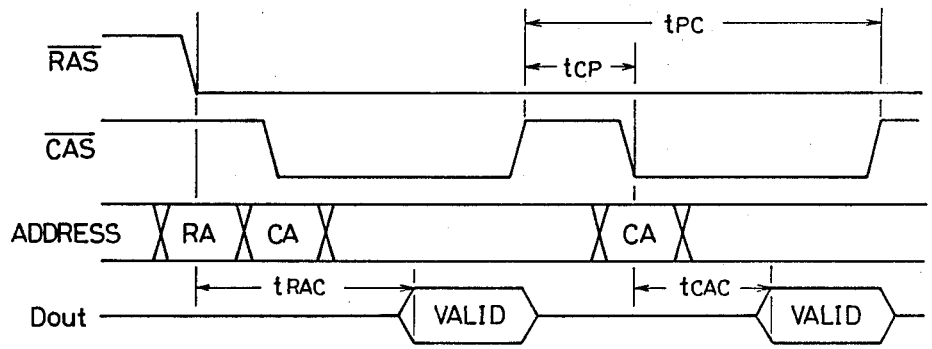
Figure 1C:
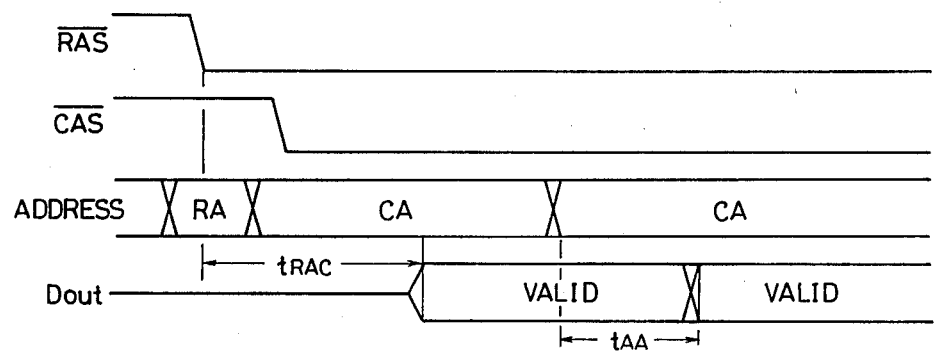
Figure 2:
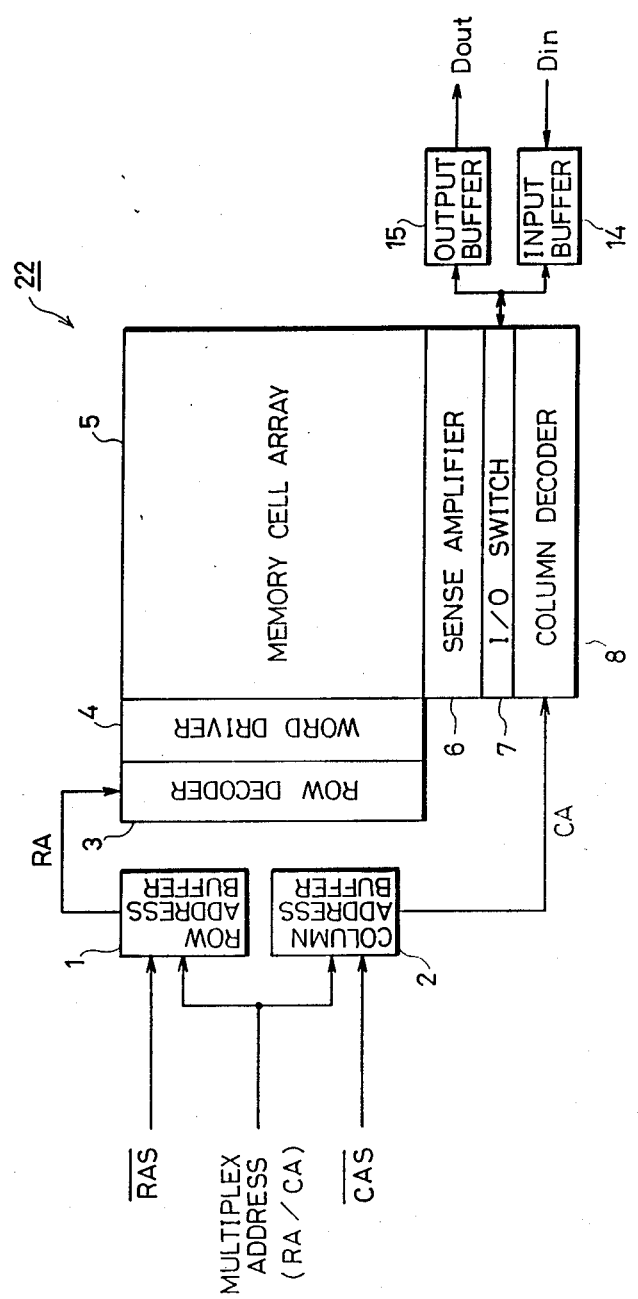
FIG. 2 is a diagram showing a semiconductor memory device used for a conventional simple cache system.
Figure 5:
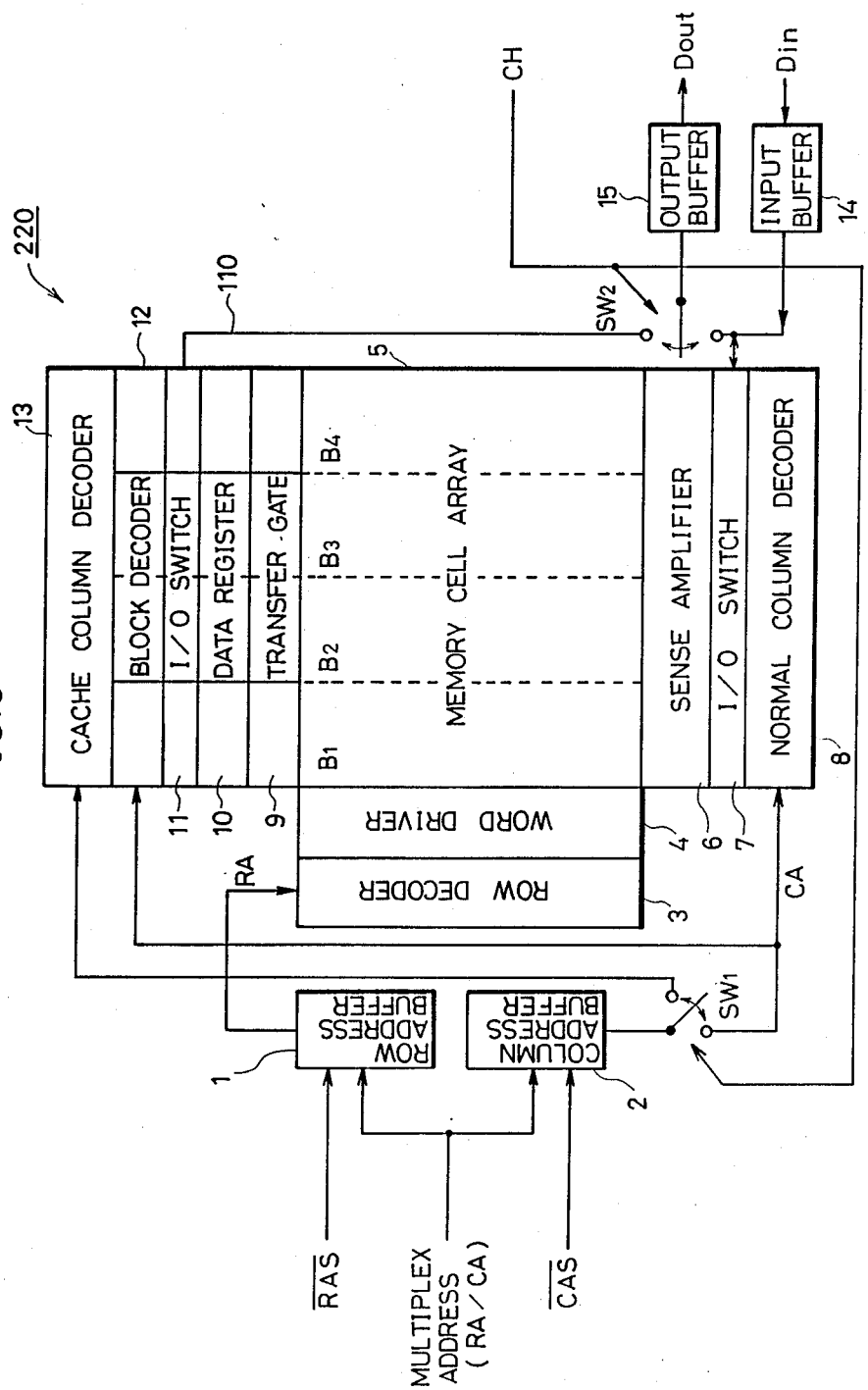
FIG. 5 is a schematic block diagram showing a semiconductor memory device according to an embodiment of the present invention.

FIG. 5 is a block diagram showing a semiconductor memory device (for example, a DRAM device) according to an embodiment of the present invention. The present embodiment shown in FIG. 5 is the same as the conventional example shown in FIG. 2 except for the following. Corresponding portions have the same reference numerals and hence, the description thereof is suitably omitted. First, a memory cell array 5 is divided into a plurality of blocks every a plurality of columns on the address space (the memory cell array 5 is divided into four blocks, i.e., B1 to B4 in FIG. 5). A transfer gate 9, a data register 10, an I/O switch 11, a block decoder 12 and a cache column decoder 13 are provided with reference to the memory cell array 5.

A switching device SW1 is a switch controlled by a CH (Cash Hit) signal externally inputted, which performs a switching operation depending on whether an external column address latched in a column address buffer 2 is to be inputted to a normal column decoder 8 or the cache column decoder 13. More specifically, the switching device SW1 supplies the external column address to the cache column decoder 13 when hit occurs while supplying the external column address to the normal column decoder 8 when miss hit occurs. In addition, the external column address supplied to the normal column decoder 8 is also supplied to the block decoder 12.

The transfer gate 9 has a function of transferring data on the same row to the data register 10 from the memory cell array 5 on a block basis. The data register 10 has a function of storing information, corresponding to a plurality of blocks, transferred from the transfer gate 9, which serves as a cache memory. The I/O switch 11 has a function of transferring to an I/O bus 110 information held in the data register 10. The block decoder 12 has a function of selecting the transfer gate 9 in response to the column address supplied through the switching device SW1. The cache column decoder 13 has a function of selecting the I/O switch 11 and reading out the information from the data register 10 in response to the column address supplied through the switching device SW1.

A switching device SW2 is a switch controlled by the CH signal, which performs a switching operation depending on whether output data to an output buffer 15 is an output of a sense amplifier 6 or an output of the data register 10. More specifically, the switching device SW2 supplies the output read out from the data register 10 to the output buffer 15 through the I/O switch 11 when hit occurs while supplying the output of the sense amplifier 6 to the output buffer 15 through an I/O switch 7 when miss hit occurs.

Figure 6:
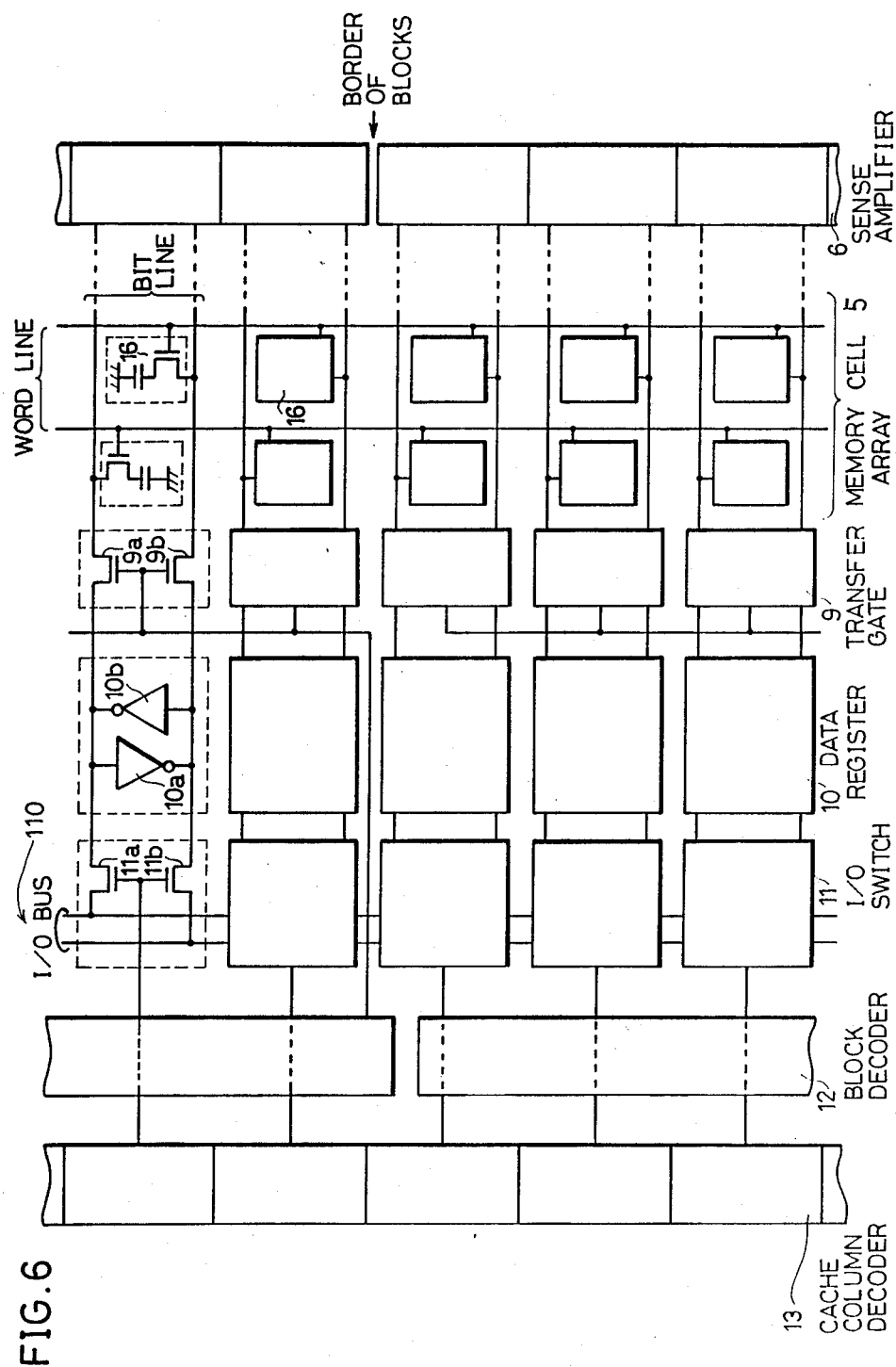
FIG. 6 is is a diagram showing in detail a part of a sense amplifier 6, a memory cell array 5, a transfer gate 9, a data register 10, an I/O switch 11, a block decoder 12 and a cache column decoder 13 shown in FIG. 5.

FIG. 6 is a diagram showing structure of part of the sense amplifier 6, the memory cell array 5, the transfer gate 9, the data register 10, the I/O switch 11, the block decoder 12 and the cache column decoder 13 shown in FIG. 5. As shown in FIG. 6, a memory cell array 5 has a plurality of pairs of bit lines and a plurality of word lines intersecting with each other, memory cells 16 being provided at intersections of the bit lines and the word lines, respectively. Sense amplifiers 6 are provided in ends of the bit line pairs, respectively. Transfer gates 9 are provided between the bit line pairs and data registers 10, respectively. Each of the transfer gates 9 comprises a transistor 9a interposed between one bit line of each of the bit line pairs and each of the data registers 10 and a transistor 9b interposed between the other bit line and each of the data registers 10. The transfer gates 9 are adapted to be simultaneously selected by a block decoder 12 every block of the memory cell array 5. Each of the data registers 10 comprises two inverters 10a and 10b connected in antiparallel. I/O switches 11 are provided for each bit line pair. Each of the I/O switches 11 comprises a transistor 11a interposed between one bit line of each of the bit line pairs and an I/O bus 110 and a transistor 11b interposed between the other bit line and the I/O bus 110. Each of the I/O switches 11 is adapted to be individually selected by a cache column decoder 13.

Figure 3:
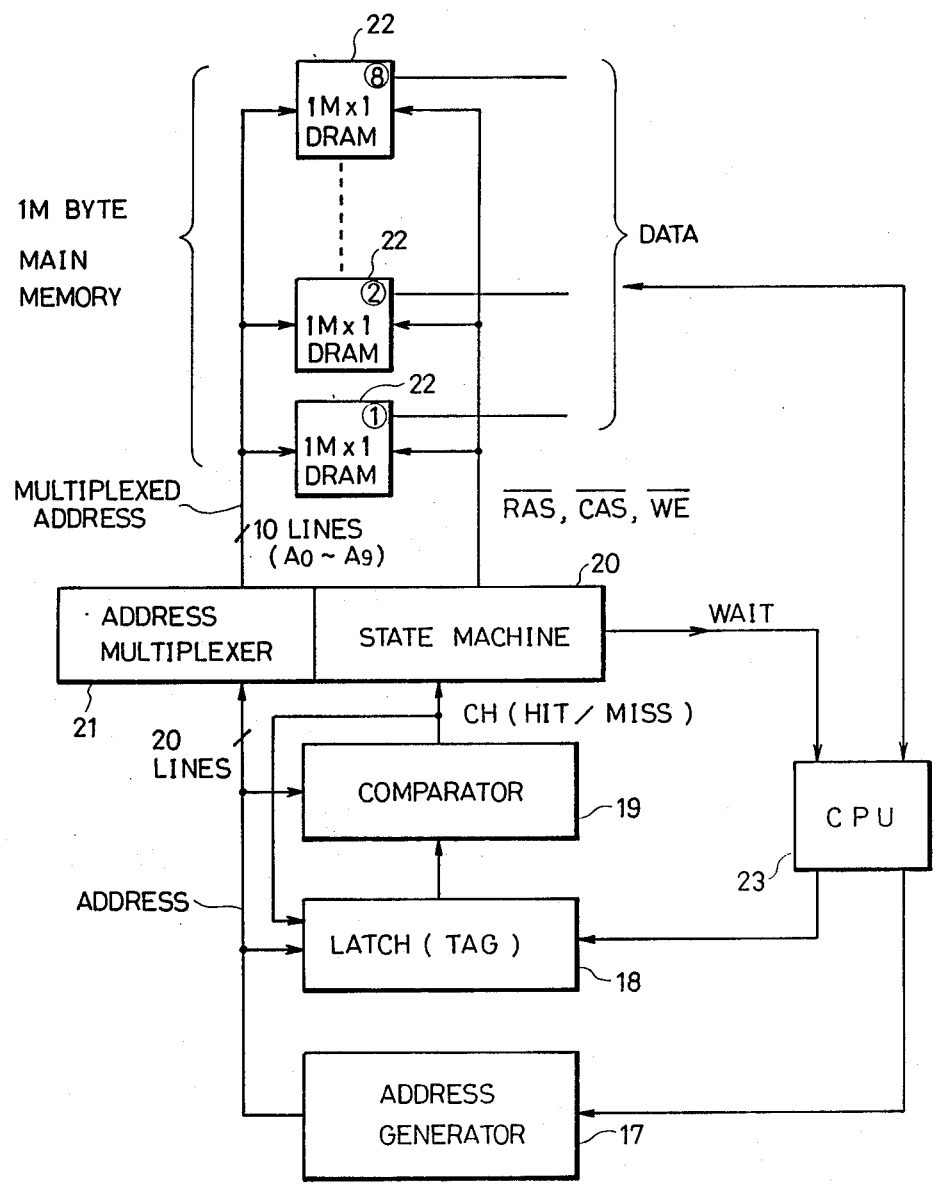
FIG. 3 is a block diagram showing a conventional simple cache system configured using by the conventional semiconductor memory device shown in FIG. 2.
Figure 4:
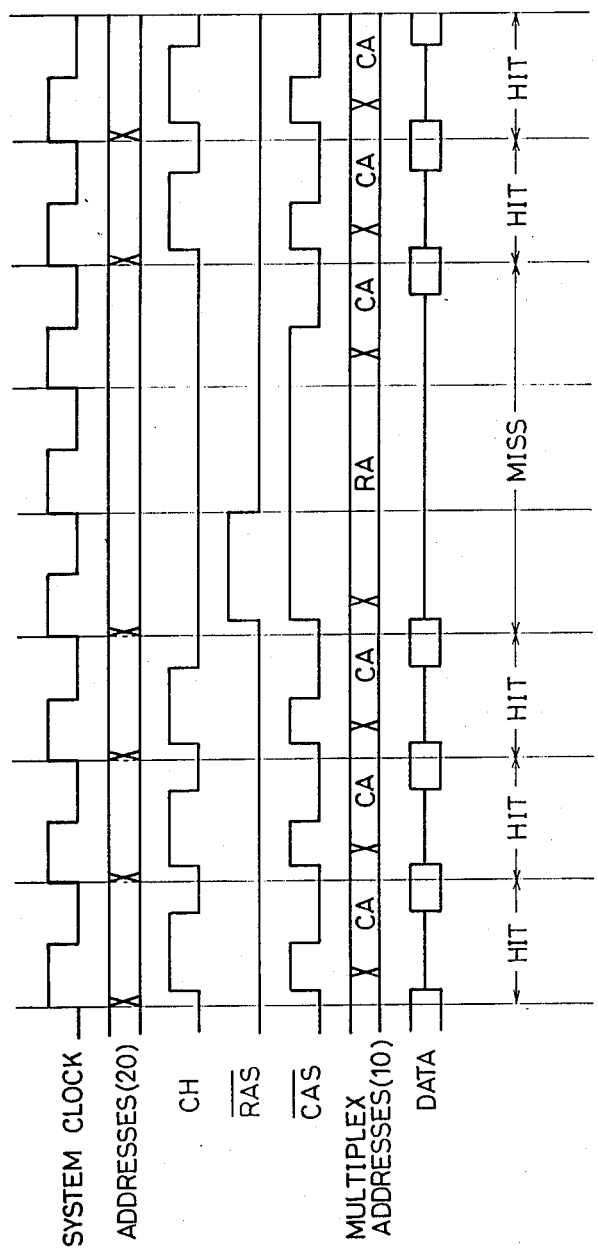
FIG. 4 is a timing chart for explaining an operation of the simple cache system shown in FIG. 3.
Figure 7:
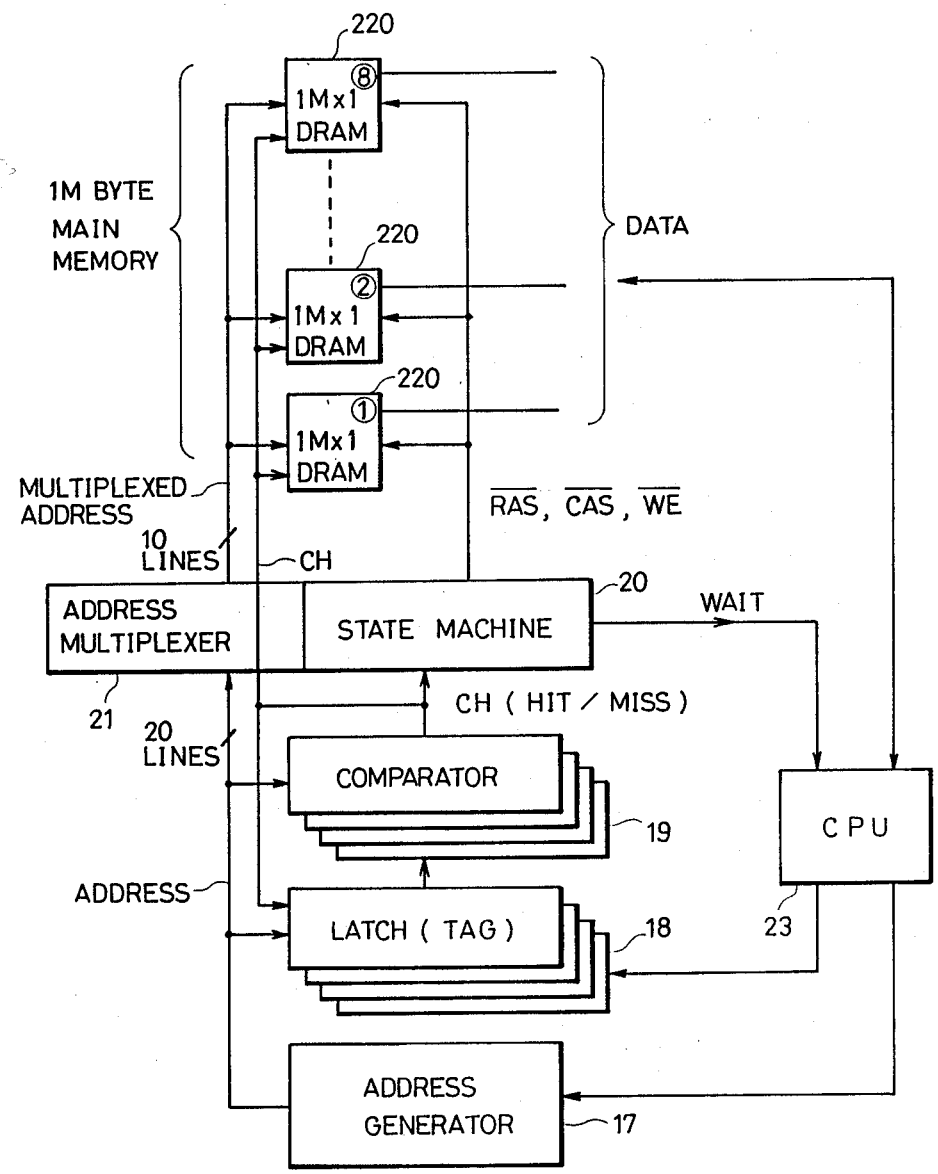
FIG. 7 is a block diagram showing structure of a simple cache system configured using the semiconductor memory device shown in FIG. 5.

FIG. 7 is a block diagram showing the outline of a simple cache system configured using the DRAM devices 220 shown in FIG. 5. The simple cache system shown in FIG. 7 is a 1 M byte system comprising 8 DRAM devices 220 each having a 1M×1 structure, similarly to the conventional simple cache system shown in FIG. 3. The difference from the conventional system shown in FIG. 3 is that a CH signal which is an output of comparators 19 is also inputted to the DRAM devices 220 and the number of TAGs18 and the number of comparators 19 are increased corresponding to the number of blocks of each of the DRAM devices 220.

Referring now to timing charts of FIGS. 1A to 1C and FIG. 4 used for explaining the conventional simple cache system, description is made on an operation of the simple cache system shown in FIG. 7.

First, an address generator 17 generates addresses of data which the CPU23 requires. Each of the comparators 19 compares 10 address lines corresponding to a row address (RA) out of 20 address lines and a plurality of column address lines for designating blocks each comprising a plurality of columns of each of the DRAM devices (two column address lines because four blocks are provided in FIG. 5) with a set of addresses for a cache held in each of the TAGs18. A set of row addresses accessed in the newest cycle for each block is set in each of the TAGs18. In addition, a set of addresses frequently used may be fixedly set in each of the TAGs18. When one of the comparators 19 detects a coincidence of addresses, it means that cache hit occurs, so that the comparators 19 generate a CH signal. A state machine 20 is responsive to generation of the $\overline{CH}$ signal for toggling a $\overline{CAS}$ signal while holding an $\overline{RAS}$ signal at a low level. Furthermore an address multiplexer 21 supplies a column address (CA) corresponding to 10 column address lines to each of the DRAM devices 220. At that time, as shown in FIG. 5, in each of the DRAM devices 220, the column address (CA) is supplied to the cache column decoder 13 by the action of the switching device SW1 in response to input of the CH signal. The cache column decoder 13 responsively turns on the I/O switch 11 corresponding to the column addresses, to output information held in the data register 10 corresponding to the column addresses to the output buffer 15 through the I/O bus 110 and the switching device SW2. Thus, when hit occurs, output data is obtained from the data register 10 at high speed in an access time of $t_{CAC}$ as in the page mode.

On other hand, when sets of row and column addresses inputted to each of the comparators 19 do not coincide with the content of each of the TAGs18, it means that miss hit occurs, so that the comparator 19 does not generate the CH signal. In this case, the state machine 20 performs $\overline{RAS}$ and $\overline{CAS}$ control in the normal read cycle. The address multiplexer 21 supplies to each of the DRAM devices 220 addresses multiplexed in the order of the row address (RA) and the column address (CA). Thus, when miss hit occurs, data is outputted at low speed in an access time of $t_{RAC}$, so that the state machine 20 generates a WAIT signal, to bring the CPU23 into a WAIT state. When miss hit occurs, data in a block to which a memory cell accessed that time belongs are simultaneously transferred from the bit line to the data register 10 through the transfer gate 9 which is rendered conductive in response to an output of the block decoder 12, so that the content stored in the data register 10 in this block is rewritten. At the same time, new sets of row and column addresses accessed this time are set in the TAG18 corresponding to the block.

As described in the foregoing, according to the embodiment shown in FIGS. 5 to 7, the data length of one block is decreased, so that data corresponding to a plurality of blocks are held in the data register 10 serving as a cache memory, and address data corresponding to a plurality of blocks are also entered in each of the TAGs18. Contrary to this, in the conventional cache system, data corresponding to one row of the memory cell array 5 are always handled as one block, so that address data entered in the TAG18 correspond to only one block. Therefore, on a block basis, a hit rate in the conventional cache system of large data length is higher. However, in general, data continuously used very often are stored in the memory cell array 5 close to each other in the row direction (more specifically, storage data have locality). Thus, even if the data length of one block is decreased, the hit rate is not so lowered. Thus, as a whole, the hit rate in the present embodiment is higher in which the number of blocks to be always held is large. More specifically, in the conventional cache system, the data length of one block is unnecessarily large, so that the cache memory is not efficiently employed.

Figure 8:
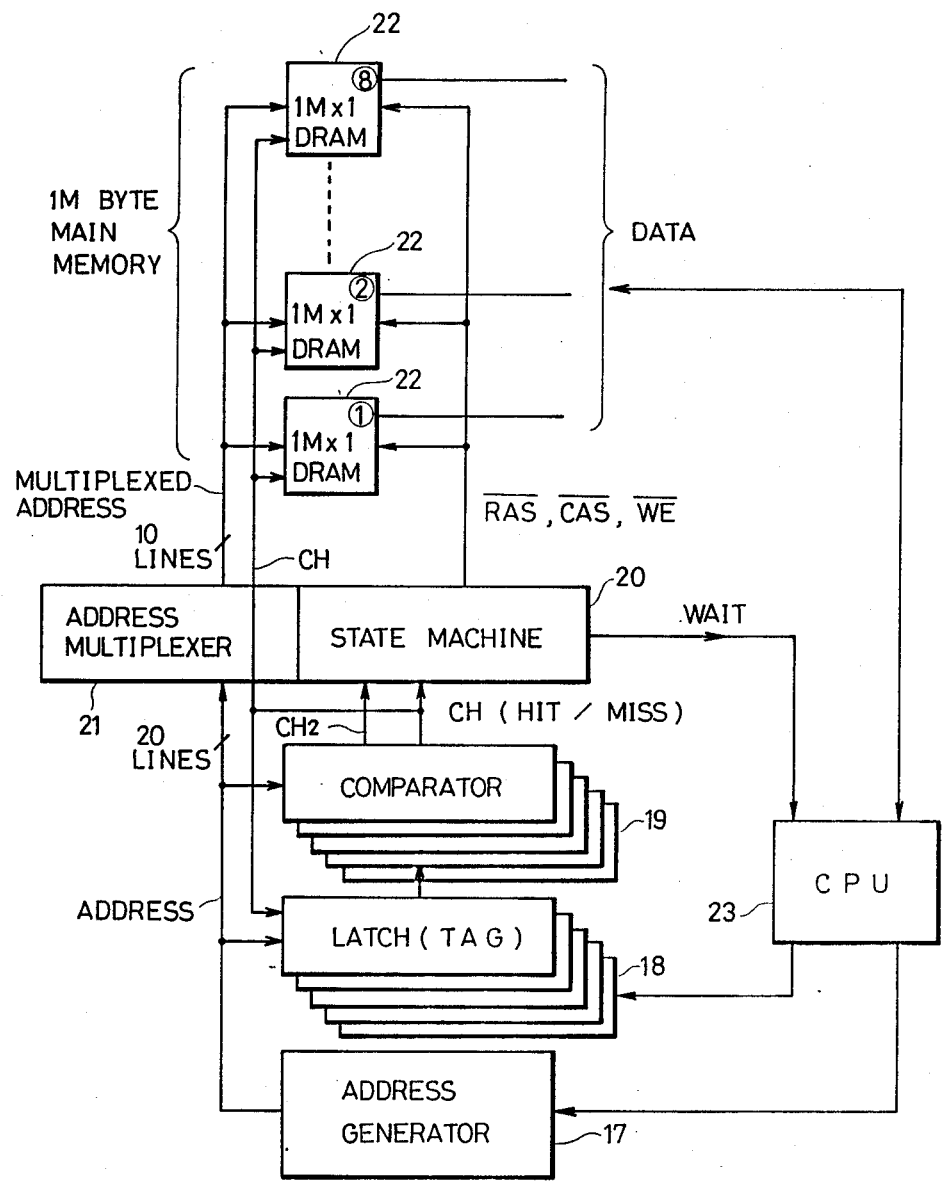
FIG. 8 is a diagram showing a simple cache system configured using a semiconductor memory device in which both a data register and a sense amplifier are used as a cache memory.

Although in the above described embodiment, description was made on structure in which only the data register 10 is utilized as a cache memory, not only the data register 10 but also the sense amplifier 6 may be used as a cache memory (more specifically, the conventional page mode and the static column mode may be also utilized as a cache). FIG. 8 shows structure of a system in which both the data register 10 and the sense amplifier 6 are used as a cache memory. Each of the DRAM devices 220 is the same as that shown in FIG. 5. In FIG. 8, a TAG18 for holding a row address (RA) accessed in the preceding cycle and a comparator 19 for comparing the row address with the current address are added other than the comparators and the TAGs for a data register. The comparator 19 generates the CH signal as described above when hit occurs in the date register 10 while generating a CH2 signal in place of the CH signal when hit occurs in the sense amplifier 6. When the CH signal is generated, as described above, data is read out from the data register 10 corresponding to the column address, to be outputted. On the other hand, when the CH2 signal is generated, the state machine 20 operates each of the DRAM devices 220 in the normal page mode or the static column mode. More specifically, in this case, data is outputted from the sense amplifier 6 corresponding to the column address.

Figure 9:
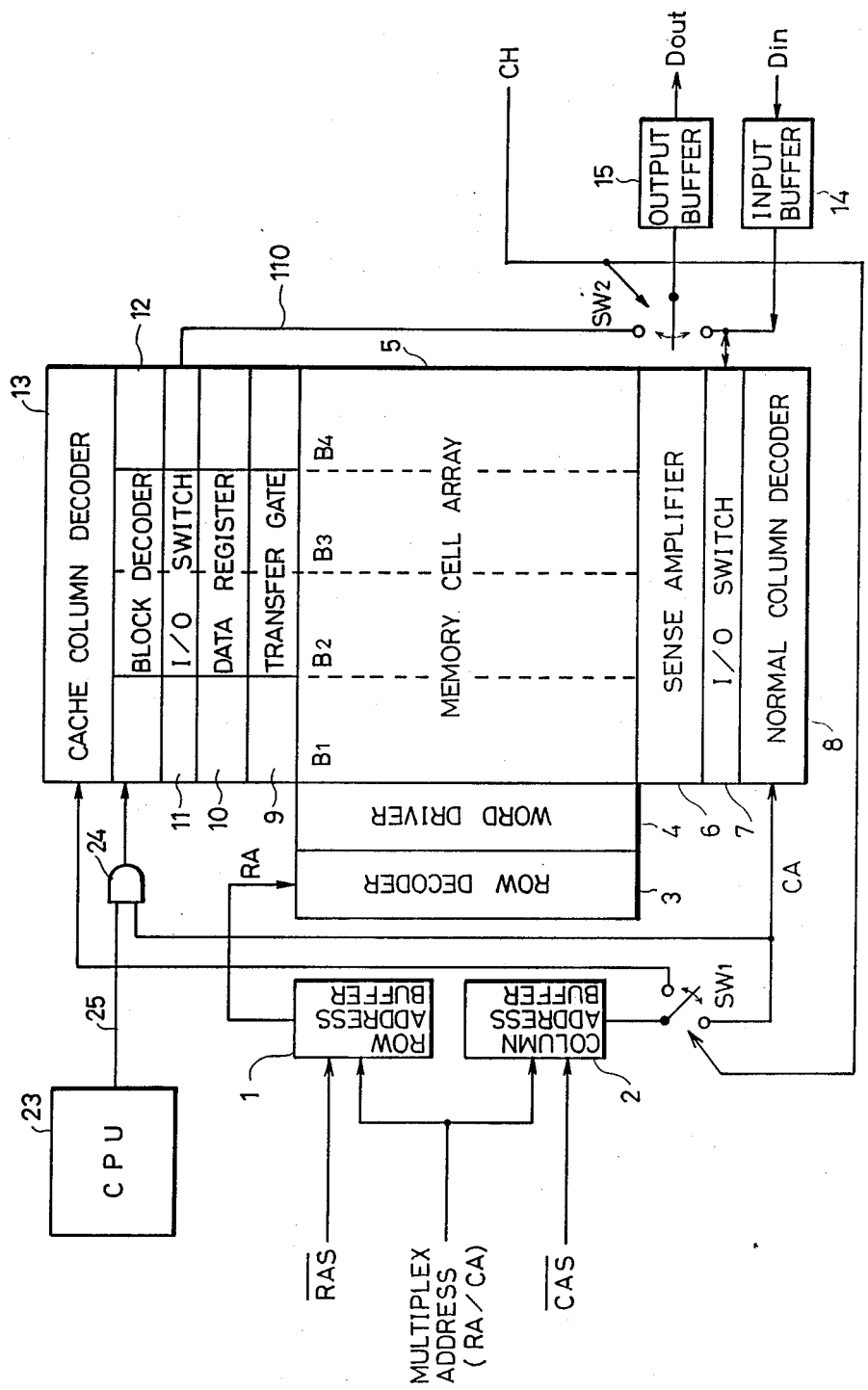
FIG. 9 is a block diagram showing another embodiment of the present invention.

Although in the embodiment shown in FIG. 5, a column decoder is unconditionally supplied to the block decoder 12 when the CH signal is inputted, to rewrite data in a block corresponding to the date register 10, it may be determined by an external apparatus (for example, the CPU23) whether or not information held in the data register 10 is rewritten when hit occurs). FIG. 9 shows structure of each of the DRAM devices in this case. As shown in FIG. 9, an AND gate 24 is provided between a block decoder 12 and a switching device SW1. Opening/closing of the AND gate 24 is controlled in response to a rewrite permit signal 25 outputted from a CPU 23. More specifically, in the embodiment shown in FIG. 9, information held in a data register 10 is rewritten only when the rewrite permit signal 25 is outputted from the CPU 23.

Additionally, although in the embodiment shown in FIG. 5, the external column address is switched by the switching device SW1 provided on each of the DRAM devices, such address switching means may be provided outside each of the DRAM devices. In this case, column addresses are independently applied from the exterior to a normal column decoder 8 and a cache column decoder 13, respectively.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device for a simple cache system, comprising:
   a memory cell array having a plurality of bit lines and a plurality of word lines arranged intersecting with the bit lines,
   a plurality of memory cells arranged at intersections of the bit lines and the word lines, respectively,
   address inputting means for receiving a row address and a column address,
   word line selecting means responsive to said row address for selecting one of said word lines, to read out to each of said bit lines information stored in respective ones of said memory cells associated with the selected word line,
   a plurality of sense amplifiers for detecting and amplifying the information stored in respective ones of said memory cells corresponding to one row read out to each of said bit lines,
   first column selecting means for selecting the sense amplifiers corresponding to a column address when the column address is applied, to read out information held in the sense amplifier,
   a plurality of block information transferring means each provided in each of blocks obtained by dividing said memory cell array into groups of said bit lines, each of said groups comprising a predetermined number of said bit lines, said block information transferring means for simultaneously transferring information from a corresponding one of said groups of bit lines of a selected blocks in response to application of said column address corresponding to the selected block,
   a plurality of data registers for storing, for each respective block, information transferred by each of said block information transferring means, and
   second column selecting means for reading out data corresponding to the column address from said data register in response to application of said column address.

2. The semiconductor memory device according to claim 1, which further comprises switching means responsive to a first control signal externally inputted for performing a switching operation depending on whether said column address is supplied to said first column selecting means or said second column selecting means.

3. The semiconductor memory device according to claim 2, wherein said first control signal is a cache hit signal indicating that information stored in said memory cell to be accessed this time is held in said data register 4. The semiconductor memory device according to claim 3, wherein said switching means supplies the column address to said block information transferring means when said column address is supplied to said first column selecting means.

5. The semiconductor memory device according to claim 4, which further comprises gate means responsive to a second control signal externally applied for gating the column address supplied to said block information transferring means from said switching means.

6. The semiconductor memory device according to claim 5, wherein said second control signal is a rewrite permit signal indicating that rewriting of information stored in said data register is permitted.

7. A semiconductor memory device including a high-speed cache system, comprising:
   a memory cell array having a plurality of bit lines and a plurality of word lines arranged intersecting with the bit lines, said memory array divided into a plurality of blocks obtained by dividing said memory cell array into groups of said bit lines, each of said groups comprising a predetermined number of said bit lines;
   a plurality of memory cells arranged at intersections of the bit lines and the word lines, respectively,
   address inputting means for receiving a row address and a column address,
   word line selecting means responsive to said row address for selecting one of said word lines for transferring to each of said bit lines information stored in respective ones of said memory cells associated with the selected word line,
   a plurality of sense amplifiers for detecting and amplifying the information stored in respective ones of said memory cells corresponding to one row read out to each of said bit lines,
   first column selecting means for selecting sense amplifiers corresponding to a column address in response to application of the column address, to read out information held in the sense amplifier,
   block information transferring means for simultaneously transferring information from a corresponding one of said groups of bit lines of a selected block in response to application of said column address corresponding to the selected block,
   a plurality of data registers for storing, for each block, information transferred by said block information transferring means, and
   second column selecting means for reading out data corresponding to the column address from said data register in response to application of said column address.

* * * * *